United States Patent
Wang

(10) Patent No.: US 6,931,299 B2
(45) Date of Patent: Aug. 16, 2005

(54) MICRO-CONTROL APPARATUS FOR CIRCULAR KNITTING MACHINES

(75) Inventor: Ping-Shih Wang, Taipei Hsien (TW)

(73) Assignee: Pai Lung Machinery Mill Co., Ltd., (TW)

( * ) Notice: Subject to any disclaimer, the term of this patent is extended or adjusted under 35 U.S.C. 154(b) by 0 days.

(21) Appl. No.: 10/753,434

(22) Filed: Jan. 9, 2004

(65) Prior Publication Data

US 2005/0085938 A1 Apr. 21, 2005

(30) Foreign Application Priority Data

Oct. 20, 2003 (TW) .............................. 92129039 A

(51) Int. Cl.[7] ............................................. G06F 19/00
(52) U.S. Cl. ..................................................... 700/141
(58) Field of Search .............................. 700/141; 66/8, 66/13, 75.2, 232, 215, 54, 57, 125 R, 132 T, 66/132 R, 231, 237, 238

(56) References Cited

U.S. PATENT DOCUMENTS

| 5,095,720 A | * | 3/1992 | Tibbals, Jr. ..................... 66/55 |
| 5,246,039 A | * | 9/1993 | Fredriksson ................ 139/452 |
| 6,233,979 B1 | * | 5/2001 | Plath ........................... 66/232 |

* cited by examiner

Primary Examiner—John Calvert
Assistant Examiner—Brian Kauffman
(74) Attorney, Agent, or Firm—Birch, Stewart, Kolasch & Birch LLP

(57) ABSTRACT

A micro-control apparatus for circular knitting machines that operates through the request of a host end including an input unit to provide operating functions, a processing unit to command input, output and communication, a communication unit to provide a communication interface and a control unit to control circular knitting machine operations. The processing unit integrates the functions of the input unit, communication unit and control unit to form the microcontroller. The processing unit thus designed can improve the overall speed and response time of circular knitting machines.

10 Claims, 4 Drawing Sheets

MICRO-CONTROL APPARATUS FOR CIRCULAR KNITTING MACHINES

This Nonprovisional application claims priority under 35 U.S.C. § 119(a) on Patent Application No(s). 092129039 filed in TAIWAN on Oct. 20, 2003, the entire contents of which are hereby incorporated by reference.

FIELD OF THE INVENTION

The present invention relates to a micro-control apparatus for circular knitting machines that employs a processing unit to integrate the functions of an input unit, a communication unit and a control unit.

BACKGROUND OF THE INVENTION

From the earliest hand driven looms to the automatic knitting machines of the present, automation widely adopted in today's modern textile industry. With raised living standards, the general public has an increased appetite for high quality garments. To meet the consumer's growing requirements, the knitting industry has to speed up production.

At present, knitting machine manufacturers generally sell the finished knitting machines and transfer the machines to textile producers after installation is completed. The knitting machines are used to produce various types of fabrics. During knitting operation, if a malfunction occurs in the knitting machine that the user cannot fix or readjust, they inform the vendor immediately. The vendor dispatches technicians for onsite repairs and maintenance to restore the knitting machine to normal operation condition.

The conventional knitting machine controller uses a Programming Logic Controller (PLC) to drive the machine. However, transmission stability is often affected by the external environment or other factors. The design and application of the controller for a conventional knitting machine may be depicted as follows:

Referring to FIG. 1, in an architecture based on a PLC 13, linking to a communication module 12 is mainly accomplished through an RS232 line 17. The communication module 12 has one end connected to a touch panel 11 through the RS232 line 17, and another end to a connection dock 14 also through the RS232 line 17. The connection dock 14 is connected to a host end 15 through an RS485 line 18. Whilst communication speed and stability are less likely to be affected by the external environment, in terms of the RS232 line 17, it has to take into account the speed and program capacity of the PLC 13. The program size of the PLC 13 is directly proportional to the program scan time. Namely, a larger program requires a longer scan time. Taking existing programs, the time required to scan a program is 24 ms. This is of great concern to the whole system. In this time interval any thing could happen. In the event of an incident taking place, and the scan time having just ended or not yet begun, it cannot be responded to by the system. The delay could create unpredictable damage to the system. Due to environmental interference, inherent quality, and quality problems of the inner elements of the PLC 13, the conventional PLC 13 generally can control only one circular knitting machine 16. To control a plurality of circular knitting machines 16 by a plurality of PLC 13 modules, the cost is significantly higher. This is an issue remaining to be overcome.

SUMMARY OF THE INVENTION

In view of the aforesaid disadvantages, the primary object of the present invention is to provide a micro-control apparatus to enhance the overall speed and response time of circular knitting machines and increase input and output points to reduce cost.

The micro-control apparatus according to the invention mainly employs a processing unit to integrate the functions of an input unit, a communication unit and a control unit to increase overall speed. In the micro-control apparatus machine elements and communication are processed by interrupt approach. The interrupt process is an instant request in the micro-control apparatus. Its response speed occurs almost at the same time when an external signal is generated. Hence there is no delay on the response time.

The foregoing, as well as additional objects, features and advantages of the invention will be more readily apparent from the following detailed description, which proceeds with reference to the accompanying drawings.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF TILE PREFERRED EMBODIMENTS

Figure 1:
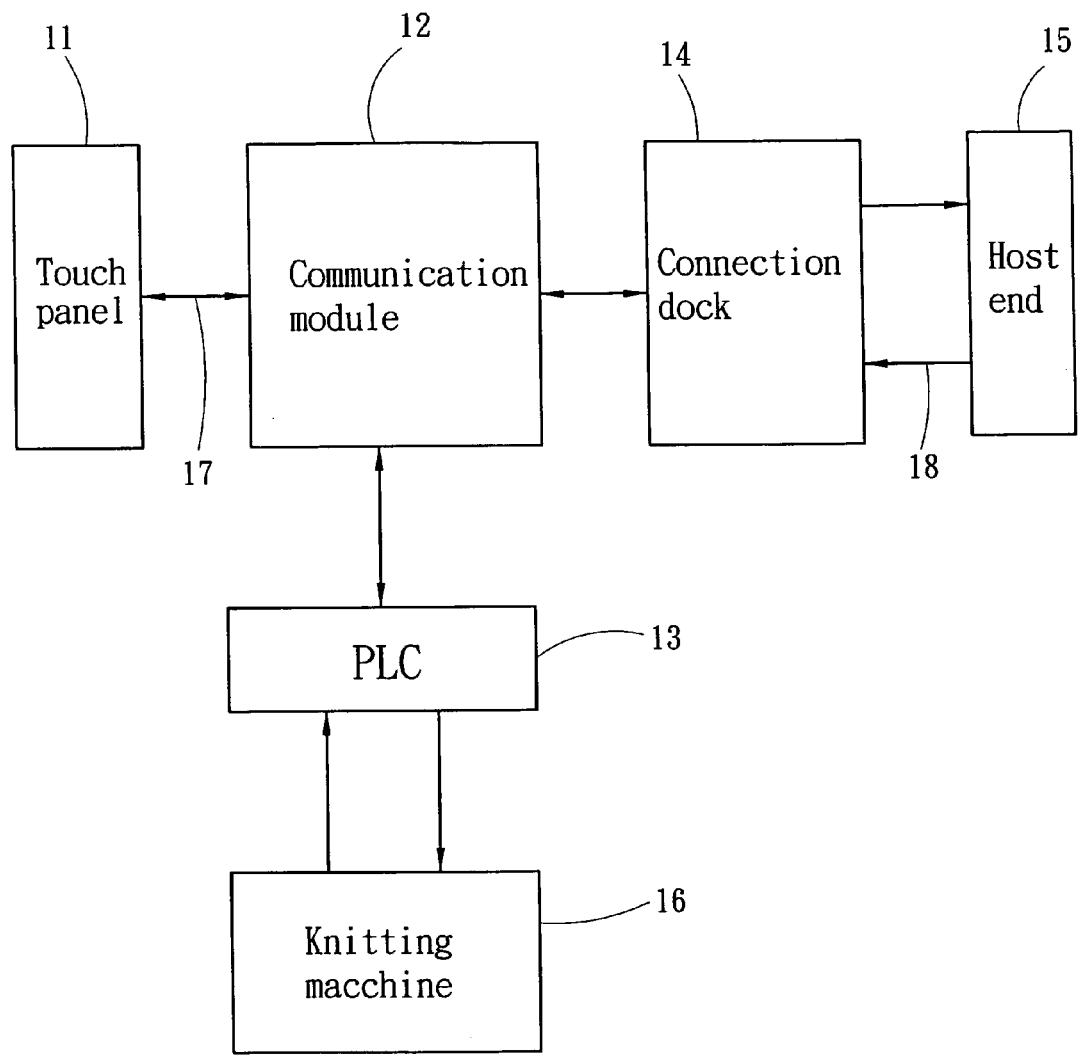
FIG. 1 is a block diagram for a conventional communication control.
Figure 2:
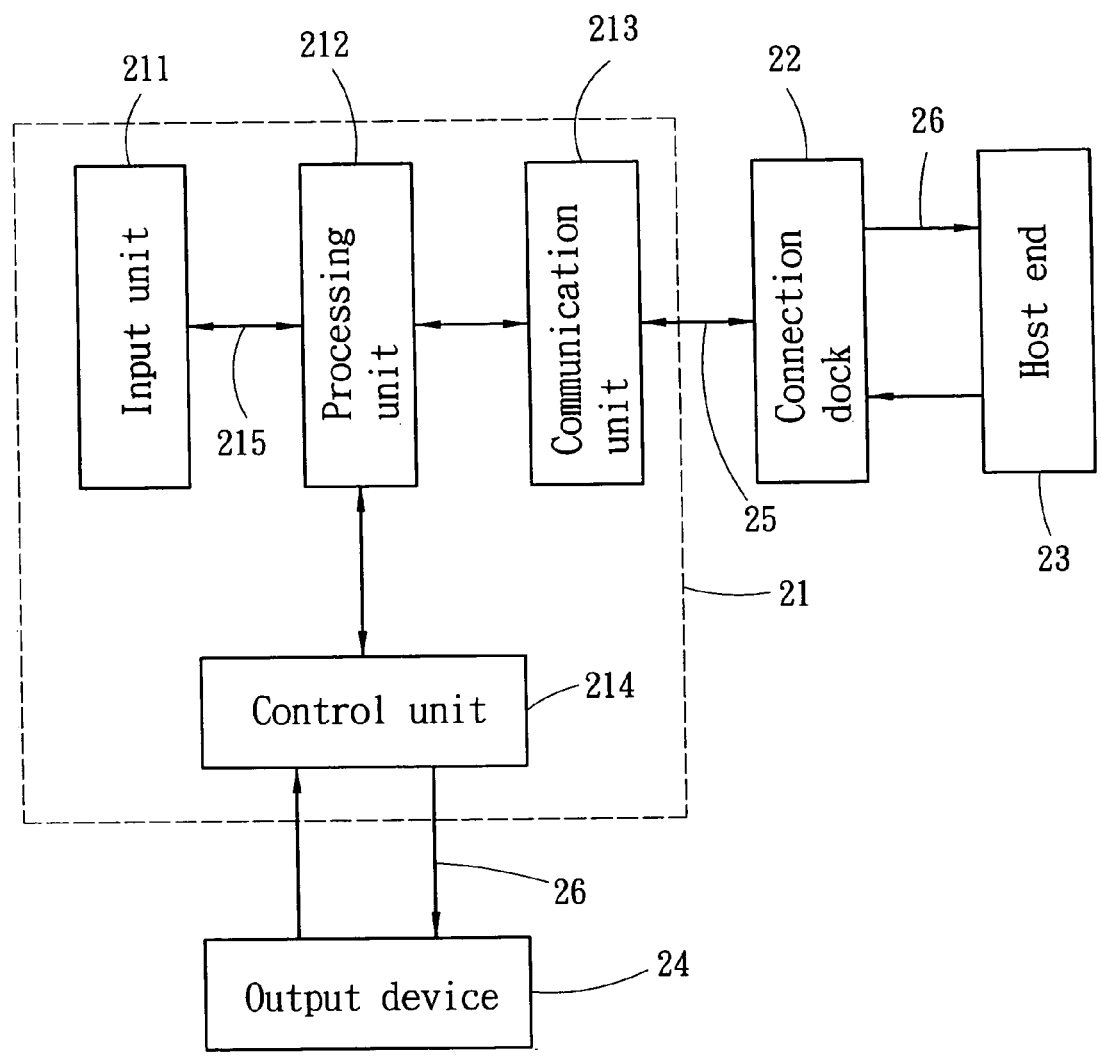
FIG. 2 is a circuit diagram of the present invention.
Figure 3:
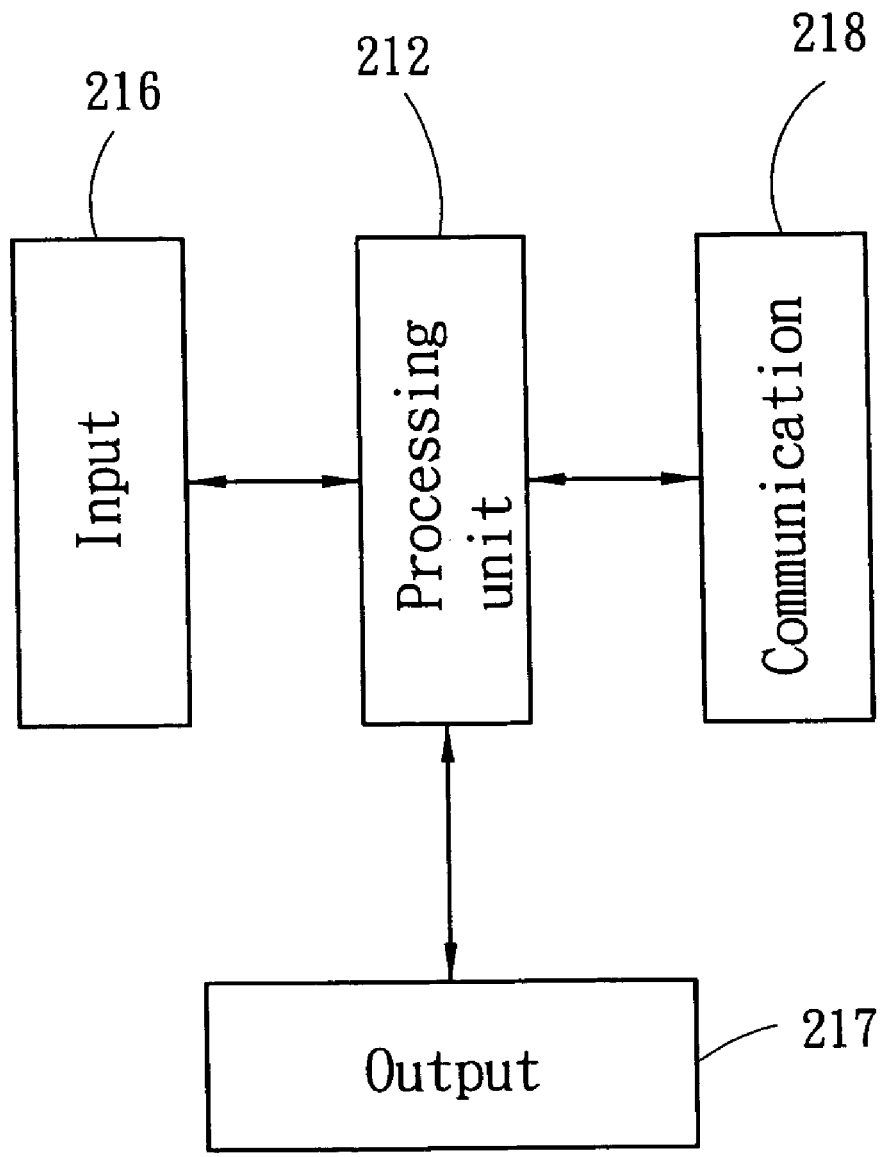
FIG. 3 is a block diagram of the processing unit of the present invention.

Please refer to FIGS. 2 and 3. A micro-control apparatus 21 according to the present invention includes:

an input unit 211 which is a touch panel to provide operation function;

a processing unit 212 which is a microcontroller to receive input signals from the input unit 211 and uses the signals to directly control other units. The processing unit 212 has three main functions that include input 216, output 217 and communication 218. It is configured and controlled through high level C language. The processing unit 212 can read and write external addresses to achieve the required functions. The processing unit 212 continuously reads the input. When the system has an abnormal input signal, it responds in real-time;

a communication unit 213 to receive the input signals from the processing unit 212 and transfer to one end of a connection dock 22 through an RS232 line 25. The connection dock 22 has another end transferring the signals to a host end 23 through an RS485 line 26. The host end 23 issues commands which are transferred to the processing unit 212 through the communication unit 213; and a control unit 214 which is a programming logic controller receives commands transferred from the processing unit 212 to activate preset programs residing therein and control an output device 24 (such as knitting machines) through the RS485 line 26. Thereby the micro-control apparatus 21 can improve the overall speed and response time of the output devices 24.

The processing unit 212 may use flat cables 215 (such as data transmission line) to link the input unit 211, communication unit 213 and control unit 214. The processing unit 212 integrates the functions of the input unit 211, communication unit 213 and control unit 214 to form the micro-control apparatus 21. To enhance data credibility, the micro-control apparatus 21 includes eight counters for hardware interrupt. In the micro-control apparatus 21, the machine elements and communication use interrupt processing. The interrupt processing is an instant request in the processing unit 212. Namely in the event an external interrupt request occurs, the processing unit 212 immediately processes the external request. Its response time is almost the same as when the external signal is generated. Hence, as long as external signals occur such as machine elements or communication and request to enter the processing unit 212, the processing unit 212 processes requests in nano-seconds. Thus, there is no response delay.

Figure 4:
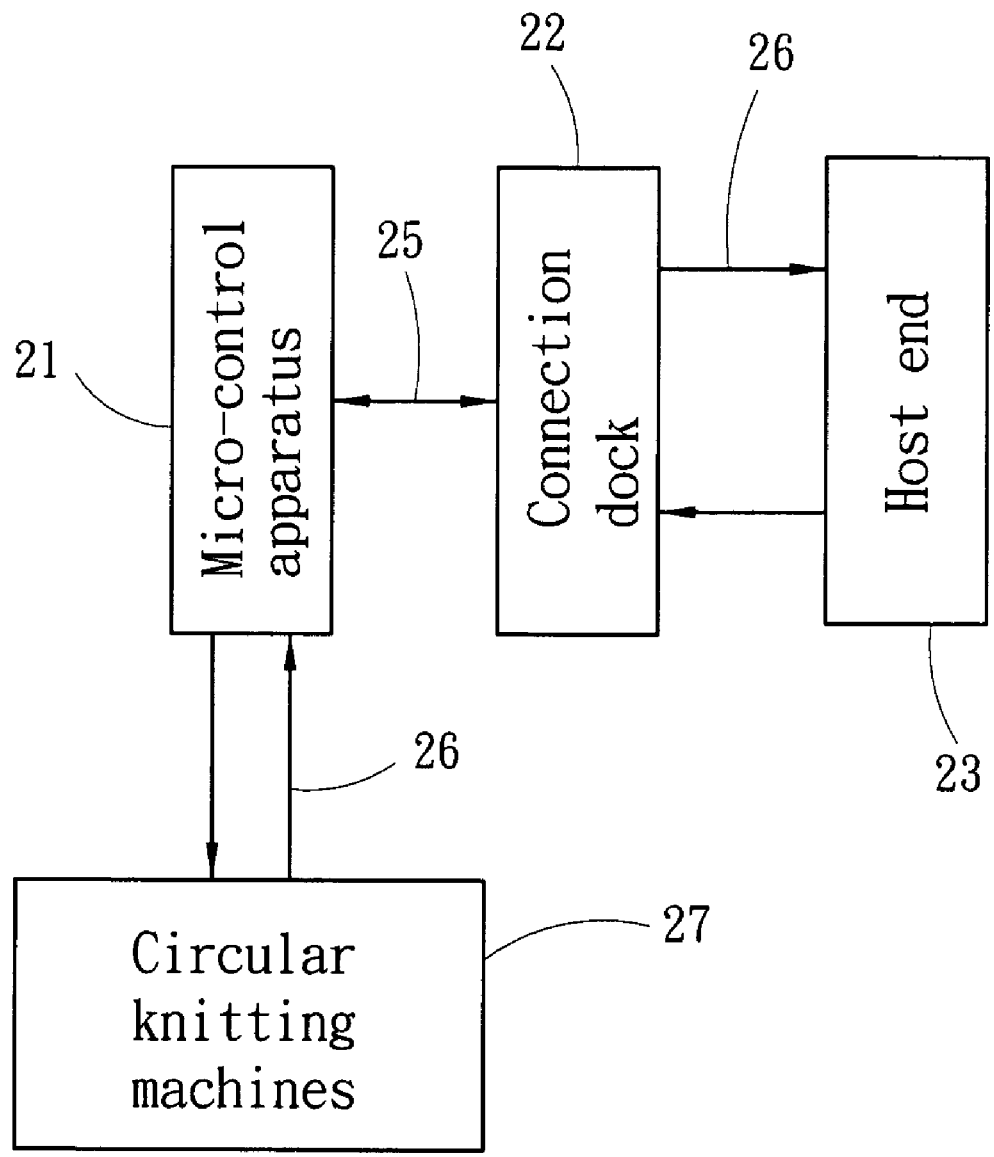
FIG. 4 is a block diagram of another embodiment of the present invention.

Refer to FIG. 4 for another embodiment of the invention. The micro-control apparatus 21 controls the operation of circular knitting machines 27 (the control process is the same as that previously discussed). Since the micro-control apparatus 21 has a much faster transmission speed than conventional techniques, it can link and control a plurality of circular knitting machines 27. Therefore production may increase. In today's fiercely competitive market place, adopting the micro-control apparatus 21 of the present invention can achieve lower product costs and improve space utilization.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A micro-control apparatus for a plurality of circular knitting machines operating through a request from a host end, comprising:
   an input unit for providing operation function to allow users to enter input signals;
   a processing unit for receiving signals from said input unit and transferring the signals to said host end, and transferring commands of said host end, interrupt processing being used in the processing unit, the signals received by the processing unit being of a same rank;
   a communication unit for receiving said signals from said processing unit and transferring said signals to said host end, said host end issuing the commands which are transferred through said communication unit and said processing unit; and
   a control unit for activating operation programs pre-stored therein according to said commands transferred from said processing unit to control the plurality of circular knitting machines,
   wherein said micro-control apparatus employs the interrupt processing to achieve an instant requirement.

2. The micro-control apparatus for circular knitting machines according to claim 1, wherein said processing unit integrates the functions of the input unit, said communication unit and said control unit through a flat cable to form said micro-control apparatus.

3. The micro-control apparatus for circular knitting machines according to claim 2, wherein said flat cable is an addressable data transmission line.

4. The micro-control apparatus for circular knitting machines according to claim 2, wherein said flat cable is an addressable address line.

5. The micro-control apparatus for circular knitting machines according to claim 2, wherein said microcontroller includes eight counters for hardware interrupt.

6. The micro-control apparatus for circular knitting machines according to claim 1, wherein said input unit is a touch panel.

7. The micro-control apparatus for circular knitting machines according to claim 1, wherein said processing unit is a micro-control device.

8. The micro-control apparatus for circular knitting machines according to claim 1, wherein said processing unit is a memory logic unit module.

9. The micro-control apparatus for circular knitting machines according to claim 1, wherein said processing unit is a central processing unit module.

10. The micro-control apparatus for circular knitting machines according to claim 1, wherein said control unit is a programming logic controller.

* * * * *